United States Patent [19]

Makimoto et al.

[11] 4,224,587

[45] Sep. 23, 1980

[54] COMB-LINE BANDPASS FILTER

[75] Inventors: Mitsuo Makimoto; Sadahiko Yamashita, both of Kawasaki, Japan

[73] Assignee: Matsushita Electric Industrial Co., Ltd., Osaka, Japan

[21] Appl. No.: 958,499

[22] Filed: Nov. 7, 1978

[30] Foreign Application Priority Data

Nov. 8, 1977 [JP] Japan ................................ 52-134207

[51] Int. Cl.$^2$ ................................................ H03H 7/10

[52] U.S. Cl. ..................................... 333/205; 333/209

[58] Field of Search ............... 333/203, 204, 205, 208, 333/209, 219, 222, 226, 235

[56] References Cited

U.S. PATENT DOCUMENTS

| | | | |
|---|---|---|---|
| 3,713,051 | 1/1973 | Kell | 333/205 |
| 4,121,181 | 10/1978 | Nishikawa et al. | 333/205 X |
| 4,151,494 | 4/1979 | Nishikawa et al. | 333/204 |

FOREIGN PATENT DOCUMENTS

| | | | |
|---|---|---|---|
| 1942178 | 4/1971 | Fed. Rep. of Germany | 333/203 |

*Primary Examiner*—Eugene R. LaRoche

*Attorney, Agent, or Firm*—Lowe, King, Price & Becker

[57] ABSTRACT

A comb-line bandpass filter comprising an enclosure or outer conductor and a plurality of inner conductors arranged parallel in the outer conductor. Adjacent to one end of each inner conductor a body of dielectric material is attached to provide a larger diameter, lumped capacitance section while providing a lumped inductance section in the remainder of the inner conductor. A conductive layer, conductively coupled to the outer conductor, encircles the dielectric body to act as a shield between adjacent inner conductors so that the coupling between them is concentrated in the inductive section. Overall size of the comb-line filter is reduced by reduction both in axial length of the inner conductors and the spacing between them.

7 Claims, 4 Drawing Figures

COMB-LINE BANDPASS FILTER

BACKGROUND OF THE INVENTION

The present invention relates to microwave filters and in particular to a comb-line bandpass filter of narrow bandwidth with a low insertion loss.

Prior art comb-line bandpass filter of narrow bandwidth for use in the microwave region comprises a plurality of inner conductors successively arranged in an enclosure or outer conductor, each inner conductor being conductively coupled to the outer conductor at one end thereof and capacitively coupled thereto at the other end. In order to provide a low-loss bandpass filter, it is necessary to provide a high unloaded Q value. This in turn requires that each inner conductor have a relatively greater axial length. However, for a given value of coupling between inner conductors, an increase in axial length of each inner conductor will result in a design in which they are spaced an increased distance from each other to compensate for the increase in coupling, so that the overall size of the bandpass filter is considerable.

SUMMARY OF THE INVENTION

An object of the invention is to provide a comb-line bandpass filter which is compact and easy to manufacture.

The present invention contemplates the use of a body of dielectric material surrounding a portion of each inner conductor adjacent to one end thereof and a conductive layer encircling the dielectric body. The latter is conductively coupled to the outer conductor so that it serves as a shield between adjacent inner conductors to concentrate the coupling therebetween in the area not occupied by the dielectric body. This dielectric body can be considered as a lumped capacitance section while the remainder can be considered as a lumped inductance section. The axial dimensions of the capacitance and inductance sections are so determined as to provide a minimum total length of the inner conductor at a given resonant frequency. Due to the provision of the dielectric body, the total capacitance is increased while the total inductance is decreased with the result that the total length of the inner conductor is reduced. Since couplings between adjacent inner conductors are concentrated in the inductive section having a smaller diameter than the capacitance section, they can be spaced a small distance as compared to those without the capacitive section.

BRIEF DESCRIPTION OF THE DRAWINGS

The invention will be further described in detail with reference to the accompanying drawings, in which.

DETAILED DESCRIPTION

Figure 1:
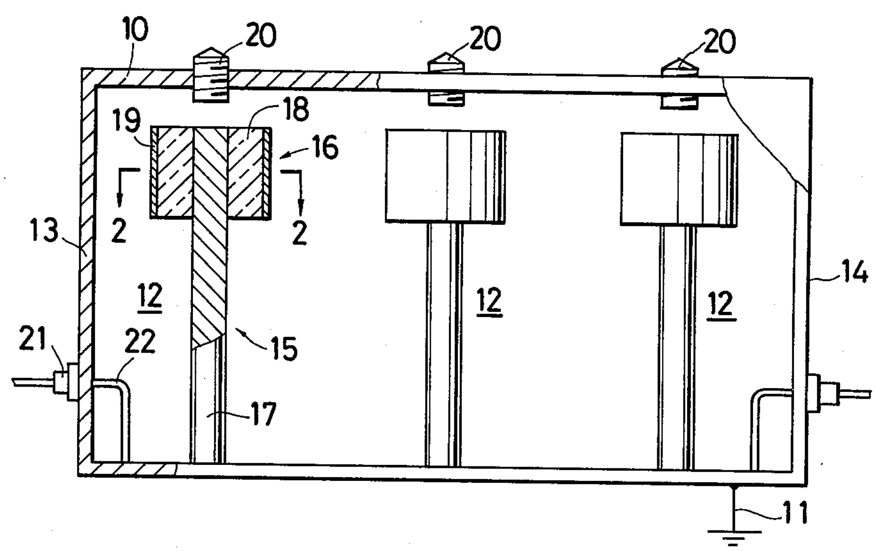
FIG. 1 is an illustration of a quarter wave comb-line bandpass filter according to the invention.
Figure 2:
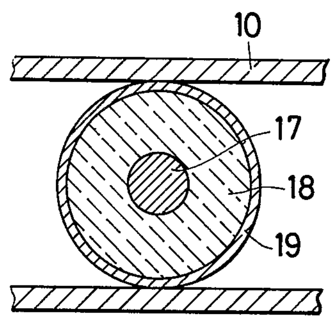
FIG. 2 is a cross-sectional view taken along lines 2—2 of FIG. 1.

There is shown in FIG. 1 a quarter wave comb-line bandpass filter embodying the present invention. The bandpass filter comprises an outer conductor 10 which is conductively coupled to a common ground at 11, and a plurality of resonators or transmission-line elements 12 arranged parallel within the outer conductor 10 between the input end wall 13 and the output end wall 14. Each of the transmission-line elements 12 is composed of two sections of different diameters, namely, a smaller diameter section 15 and a larger diameter section 16. The smaller diameter section 15 is formed by a cylindrical rod 17 which extends the length of the transmission-line element and is conductively coupled to the outer conductor 10 at the bottom end to act as an inner conductor and capacitively coupled thereto at the top end. The larger diameter section 16 is formed by a dielectric body 18 attached to the inner conductor 17 adjacent to the top end thereof and a conductive cylinder 19 encircling the dielectric body 18. The dielectric body 18 is preferably constructed of a low loss dielectric material such as alumina ceramics. The cylindrical conductor 19 is conductively connected to the side walls of the outer conductor 10 as illustrated in FIG. 2 to serve as a shield to reduce coupling between adjacent transmission-line elements.

The capacitive coupling of each resonator to the outer conductor 10 is adjusted by means of an adjustment screw 20. This provides frequency fine control. Microwave energy is injected to the interior of the bandpass filter through an input terminal 21 which leads to a looped conductor 22 and detected by a looped conductor 23 which leads to an output terminal 24 from which the filtered microwave energy is delivered.

The inductance of the smaller diameter section 15 of the transmission-line element 12 is large compared to the inductance of the larger diameter section 16 and the capacitance of the larger diameter section is large compared to the capacitance of the smaller diameter section so that it may be assumed that the inductance is concentrated in the smaller diameter section and the capacitance in the larger diameter section. The provision of the capacitive, larger diameter section 16 will permit the transmission line 12 to have a larger capacitance value and a smaller inductance value than it would have without the section 16, so that at a given resonant frequency, the overall length of the transmission-line element 12 is smaller than it would otherwise have. Since the coupling between adjacent resonators is concentrated in the inductance, smaller diameter sections of the resonators, they can be arranged a smaller distance apart from each other than would be otherwise. Therefore, the bandpass filter of the invention has a small overall size compared to the prior art filter.

Figure 3:
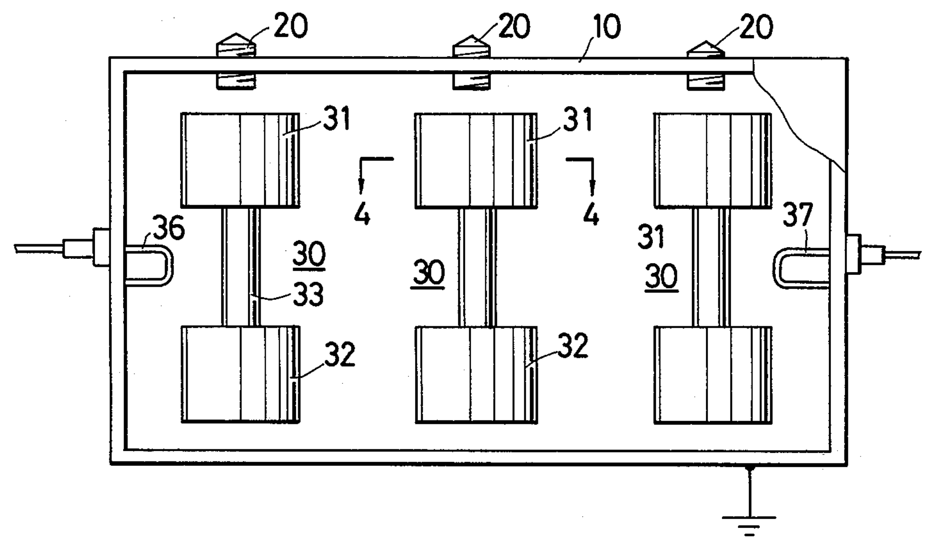
FIG. 3 is an illustration of a half wave comb-line bandpass filter according to the invention.
Figure 4:
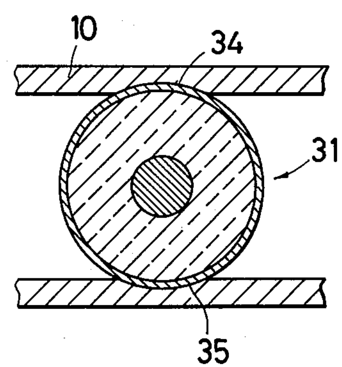
FIG. 4 is a cross-sectional view taken along lines 4—4 of FIG. 3.

FIG. 3 is an illustration of a half wave comb-line bandpass filter of the invention which differs from the filter construction of FIG. 1 in several respects. The resonator 30 is composed of two larger diameter sections 31 and 32 of the same diameter and a smaller diameter section 33 intermediate the larger diameter sections 31 and 32. Each of the larger diameter sections 31, 32 is constructed in the same manner as the larger diameter section 16 of the filter of FIG. 1 and the intermediate section 33 is formed by a cylindrical body which extends the length of the transmission line and is capacitively connected to the outer conductor 10 at opposite ends of the line. The inner walls of the outer conductor 10 are formed with recesses 34, 35 in which the larger diameter sections 31 and 32 of each resonator are positioned as illustrated in FIG. 4. The input and output loops 36 and 37 are each located is a position corresponding substantially to the center line of the outer conductor 10 which intersects the intermediate section of each resonator.

Since the larger diameter section of each inner conductor is connected to the outer conductor, the comb-line filter of the invention is resistant to mechanical shocks.

In practical embodiment, the conductive layer 19 which surrounds the dielectric body may be provided by the conventional metalization method. Since each transmission-line element is a one-piece construction, the invention provides an ease with which the transmission-line elements are assembled within the outer conductor. Adjustment of capacitive coupling between each transmission-line element and the outer conductor by the adjustment screws 12 can also be effected with ease.

What is claimed is:

1. A comb-line bandpass filter comprising:

an outer conductor;

a plurality of inner conductors successively arranged parallel within said outer conductor, one end of each of said inner conductors being capacitively coupled to said outer conductor;

a body of dielectric material encircling a portion of each of said inner conductors adjacent to said one end thereof;

a layer of conductive material encircling said dielectric body and conductively coupled to said outer conductor; and means for injecting microwave energy into said outer conductor at one end wall thereof and withdrawing said injected energy from the outer end wall thereof.

2. A comb-line bandpass filter as claimed in claim 1, wherein the other end of each of said inner conductors is conductively coupled to said outer conductor.

3. A comb-line bandpass filter as claimed in claim 1, further comprising a second body of dielectric material encircling another portion of each of said inner conductors adjacent to the other end thereof and a second layer of conductive material encircling said second dielectric body and conductively coupled to said outer conductor, the other end of each of said inner conductors being capacitively coupled to said outer conductor.

4. A comb-line bandpass filter as claimed in claim 1 or 3, wherein said dielectric material is alumina ceramics.

5. A comb-line bandpass filter comprising:

A conductive enclosure having first and second pairs of end walls and a pair of side walls;

a plurality of cylindrical conductors successively arranged parallel in said enclosure between said first pair of end walls, each of said cylindrical conductors having one end thereof being capacitively coupled to one end wall of said second pair of the enclosure;

a cylindrical body of dielectric material having an axial length smaller than the length of said cylindrical conductor and attached to and encircling a portion of each of said conductors adjacent to said one end thereof;

a layer of conductive material attached to and encircling said cylindrical dielectric body and conductively coupled to said side walls of said enclosure; and input and output means provided on the end walls of said first pair respectively for injecting microwave energy into and withdrawing same from said enclosure.

6. A comb-line bandpass filter as claimed in claim 5, wherein the other end of each of said inner conductors is conductively coupled to the other end wall of said second pair of said enclosure.

7. A comb-line bandpass filter as claimed in claim 5, further comprising a second cylindrical body of dielectric material attached to and encircling another portion of each of said cylindrical conductors adjacent to the other end thereof and a second layer of conductive material attached to and encircling said second dielectric body and conductively coupled to said side walls of said enclosure, the other end of each of said cylindrical conductors being capacitively coupled to the other end wall of said second pair.

* * * * *